United States Patent
Hamada

(10) Patent No.: US 10,605,843 B2
(45) Date of Patent: Mar. 31, 2020

(54) INVERTER OPEN/SHORT FAILURE DETECTION

(71) Applicant: Phoenix Motorcars LLC, Ontario, CA (US)

(72) Inventor: Will Hamada, Los Angeles, CA (US)

(73) Assignee: Phoenix Motorcars LLC, Ontario, CA (US)

( * ) Notice: Subject to any disclaimer, the term of this patent is extended or adjusted under 35 U.S.C. 154(b) by 0 days.

(21) Appl. No.: 15/731,860

(22) Filed: Aug. 15, 2017

(65) Prior Publication Data

US 2019/0137558 A1    May 9, 2019

(51) Int. Cl.
| | |
|---|---|
| *G01R 33/00* | (2006.01) |
| *G01R 31/00* | (2006.01) |
| *B60L 3/12* | (2006.01) |
| *H02M 1/32* | (2007.01) |
| *G01R 31/50* | (2020.01) |
| *H02M 7/5387* | (2007.01) |
| *B60L 50/51* | (2019.01) |
| *H02P 27/06* | (2006.01) |

(52) U.S. Cl.
CPC ............ *G01R 31/005* (2013.01); *B60L 3/12* (2013.01); *G01R 31/50* (2020.01); *H02M 1/32* (2013.01); *B60L 50/51* (2019.02); *B60L 2210/44* (2013.01); *B60Y 2200/91* (2013.01); *B60Y 2400/3084* (2013.01); *B60Y 2400/61* (2013.01); *H02M 7/5387* (2013.01); *H02P 27/06* (2013.01)

(58) Field of Classification Search
CPC .. G01R 31/005; G01R 31/026; G01R 31/025; B60L 3/12; B60L 50/51; B60L 2210/44; B60Y 2400/61; B60Y 2200/91; B60Y 2400/3084; H02M 7/5387; H02P 27/06
See application file for complete search history.

(56) References Cited

U.S. PATENT DOCUMENTS

| | | | |
|---|---|---|---|
| 5,274,540 A | 12/1993 | Maehara | |
| 9,335,361 B2 | 5/2016 | Hiti et al. | |
| 9,484,838 B2 | 11/2016 | Mu et al. | |
| 2009/0096394 A1* | 4/2009 | Taniguchi | H02M 1/32 318/400.09 |
| 2009/0251831 A1* | 10/2009 | Shiba | B60L 3/003 361/30 |
| 2014/0347067 A1* | 11/2014 | Hirono | H02M 1/32 324/537 |

* cited by examiner

*Primary Examiner* — Daniel R Miller
(74) *Attorney, Agent, or Firm* — Jeffrey A. McKinney; McKinney Law Group APC

(57) ABSTRACT

The present invention relates to a power circuit of an inverter for an electric vehicle, and, more specifically, to a power circuit supplying a high voltage direct current from a high voltage power source to a drive circuit for driving an AC motor for the electric vehicle. In one case, the present invention provides a method of detecting an IGBT short circuit failure or an IGBT open circuit failure during electric vehicle key ON and charging conditions. The method includes the steps of: a) receiving information that a vehicle key has been turned on; b) detecting whether there is an IGBT short circuit failure; c) initiating vehicle failure action if an IGBT short circuit failure is detected, but detecting whether there is an IGBT open circuit failure if IGBT short failure is not detected; d) determining that the vehicle is ready to drive if IGBT short failure was not detected.

2 Claims, 6 Drawing Sheets

Short Detection

Gate control

| UH | OFF | OFF | OFF | OFF | OFF | OFF |
|----|-----|-----|-----|-----|-----|-----|
| UL | OFF | OFF | OFF | OFF | OFF | OFF |
| VH | OFF | OFF | OFF | OFF | OFF | OFF |
| VL | OFF | OFF | OFF | OFF | OFF | OFF |
| WH | OFF | OFF | OFF | OFF | OFF | OFF |
| WL | OFF | OFF | OFF | OFF | OFF | OFF |

Voltage in nominal condition

| Case | U High OK | U Low OK | V High OK | V Low OK | W High OK | W Low OK |
|------|-----------|----------|-----------|----------|-----------|----------|
| Phase U | M | M | M | M | M | M |
| Phase V | M | M | M | M | M | M |
| Phase W | M | M | M | M | M | M |

Voltage in short failure condition

| Case | U High fail | U Low fail | V High fail | V Low fail | W High fail | W Low fail |
|------|-------------|------------|-------------|------------|-------------|------------|
| Phase U | H | L | M | M | M | M |
| Phase V | M | M | H | L | M | M |
| Phase W | M | M | M | M | H | L |

FIG. 2

Open Detection

Gate control

| UH | ON  | OFF | OFF | OFF | OFF | OFF |
|----|-----|-----|-----|-----|-----|-----|
| UL | OFF | ON  | OFF | OFF | OFF | OFF |
| VH | OFF | OFF | ON  | OFF | OFF | OFF |
| VL | OFF | OFF | OFF | ON  | OFF | OFF |
| WH | OFF | OFF | OFF | OFF | ON  | OFF |
| WL | OFF | OFF | OFF | OFF | OFF | ON  |

Voltage in nominal condition

| Case    | Normal | Normal | Normal | Normal | Normal | Normal |
|---------|--------|--------|--------|--------|--------|--------|
| Phase U | H      | L      | M      | M      | M      | M      |
| Phase V | M      | M      | H      | L      | M      | M      |
| Phase W | M      | M      | M      | M      | H      | L      |

Voltage in open failure condition

| Case    | U High fail | U Low fail | V High fail | V Low fail | W High fail | W Low fail |
|---------|-------------|------------|-------------|------------|-------------|------------|
| Phase U | M           | M          | M           | M          | M           | M          |
| Phase V | M           | M          | M           | M          | M           | M          |
| Phase W | M           | M          | M           | M          | M           | M          |

FIG. 3

INVERTER OPEN/SHORT FAILURE DETECTION

FIELD OF THE INVENTION

The present invention relates to a power circuit of an inverter for an electric vehicle, and, more specifically, to a power circuit supplying a high voltage direct current from a high voltage power source to a drive circuit for driving an AC motor for the electric vehicle.

BACKGROUND OF THE INVENTION

There have been reports related to the development of inverter power circuits and related methods. For instance, U.S. Pat. No. 9,484,838, entitled "Inverter and Power Supplying Method Thereof and Application Using the Same" allegedly discusses the following: "An inverter and a power supply method thereof and an application thereof are provided. The inverter includes a DC-DC conversion circuit, an inverting circuit and an auxiliary power circuit. The DC-DC conversion circuit converts a DC input voltage into a DC bus voltage. The inverting circuit is configured to convert the DC bus voltage into an AC output voltage. The auxiliary power circuit is enabled in response to the DC input voltage, and the auxiliary power circuit generates a first auxiliary power for enabling the DC-DC conversion circuit after being enabled. The DC-DC conversion circuit is enabled in response to the first auxiliary power, and the DC-DC conversion circuit generates a second auxiliary power for enabling the inverting circuit after being enabled, such that the inverting circuit is enabled in response to the second auxiliary power and generates the AC output voltage." Abstract.

U.S. Pat. No. 9,335,361, entitled "Method and Apparatus for Monitoring a Multi-Phase Electrical System on a Vehicle" supposedly reports the following: "An electric machine electrically connects to an inverter via a multi-phase power circuit. A method for monitoring the multi-phase power circuit includes non-intrusively adjusting a commanded AC electric current from the inverter after a prescribed time period and comparing a measured magnitude of AC electric current in the multi-phase power circuit with a minimum threshold. Presence of an open circuit fault in the multi-phase power circuit can be detected based upon the comparison." Abstract.

U.S. Pat. No. 5,459,641, entitled "Inverter Device for Stable, High Power-Factor Input Current Supply" purportedly discusses the following: "An inverter device for supplying a stable, high power-factor input current while restraining higher harmonics to be low is provided by a simple circuit structure in which a pulsating DC voltage supplied through a power circuit is provided to a smoothing condenser, a direct current is provided from the smoothing condenser to an inverter circuit section, and an input current path is formed from the power circuit through an impedance element to a switching element of the inverter circuit section and to part of an oscillation circuit." Abstract.

Despite reports related to the development of power circuits of inverters there is still a need in the art for novel methods using inverter power circuits.

SUMMARY OF THE INVENTION

In one case, the present invention provides a method of detecting an IGBT short circuit failure or an IGBT open circuit failure during electric vehicle key ON and charging conditions. The method includes the steps of: a) receiving information that a vehicle key has been turned on; b) detecting whether there is an IGBT short circuit failure; c) initiating vehicle failure action if an IGBT short circuit failure is detected, but detecting whether there is an IGBT open circuit failure if IGBT short failure is not detected; d) determining that the vehicle is ready to drive if IGBT short failure was not detected.

BRIEF DESCRIPTION OF THE FIGURES

FIG. 2 shows the failure detection table for short circuits.
FIG. 3 shows the failure detection table for open circuits.

DETAILED DESCRIPTION OF THE INVENTION

An Electric Vehicle's inverter is a high-power electronics device that converts electricity derived from a direct current ("DC") source (i.e., the vehicle battery) to alternating current ("AC") that is used to drive the traction motor. At the heart of the inverter are several insulated gate bipolar transistors ("IGBT"s) in an "H-bridge" configuration that convert the DC voltage into a square wave, AC voltage.

IGBT failures can significantly impact the electric vehicle high voltage system. The detection of such failures would allow one to optimize electric vehicle maintenance and durability, as well as protect high voltage components.

The present invention relates to detection methodology (devices, procedures and methods) that enables one to detect IGBT short failure and IGBT open failures during key ON and Charging conditions. The detection in a propulsion inverter system uses simple circuits and resistors R, specifically in non-driving conditions such as stand-by or charging.

If all IGBTs are working fine, when they are in OFF condition, phase voltage U, V and W will be balanced in the middle of +DC/−DC voltage by two dividing resistors R. If the upper arm of U phase has failed because of short-circuit, the voltage U will be out of balance and will stay at +DC. This method can be applied to all three phases in the same manner for both open and short detection.

Figure 1:
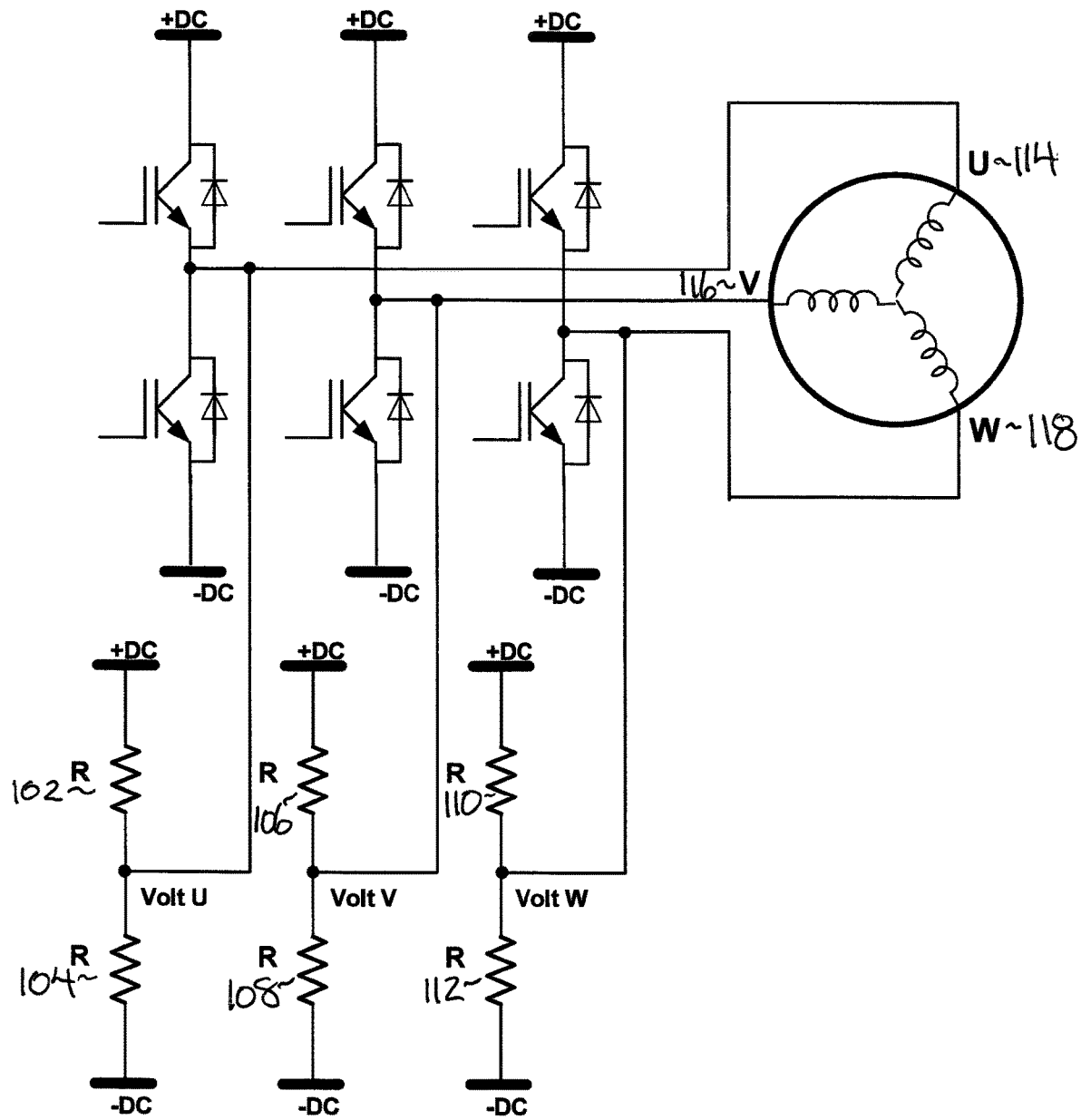
FIG. 1 shows the basic structure of three phase inverter and the fault measurement circuits.

FIG. 1 is the basic structure of three phase inverter driver and phase voltage measurement with six resistors R (102, 104, 106, 108, 110, 112) connecting to the high voltage DC+/DC−. If all IGBTs are OFF, all three-phase voltage U (114), V (116), W (118) will be in the middle of DC+/DC−. This is the nominal condition.

FIG. 2 shows the short failure detection. In short failure, detection all IGBT gates are OFF so phase voltages U, V and W will be in the middle. If one of the IGBT is in short circuit failure, the phase voltage won't stay in the middle. For example, if the upper IGBT of phase U has short circuit failure, the phase voltage will be high (highlighted in red in the third table of FIG. 2). Also, if the lower IGBT of phase U has short circuit failure, the phase voltage will be low (highlighted in red in the third table of FIG. 2). This detection logic can be applied to all phases in a same manner.

FIG. 3 shows the open failure detection. In open failure, detection each IGBT will be turned ON to check open failure. For example, to see the condition of the upper of phase U, the IGBT will be turned ON. If the phase U voltage becomes high, it is working fine but in case of open circuit failure, the phase U stays in the middle (highlighted in red in the third table of FIG. 3). Also in case of the lower phase U, if the phase U voltage becomes low, it is working fine but if the phase U stays in the middle, it is in open circuit failure (highlighted in red in the third table of FIG. 3). This detection logic can be applied to all phases in a same manner.

Figure 4:
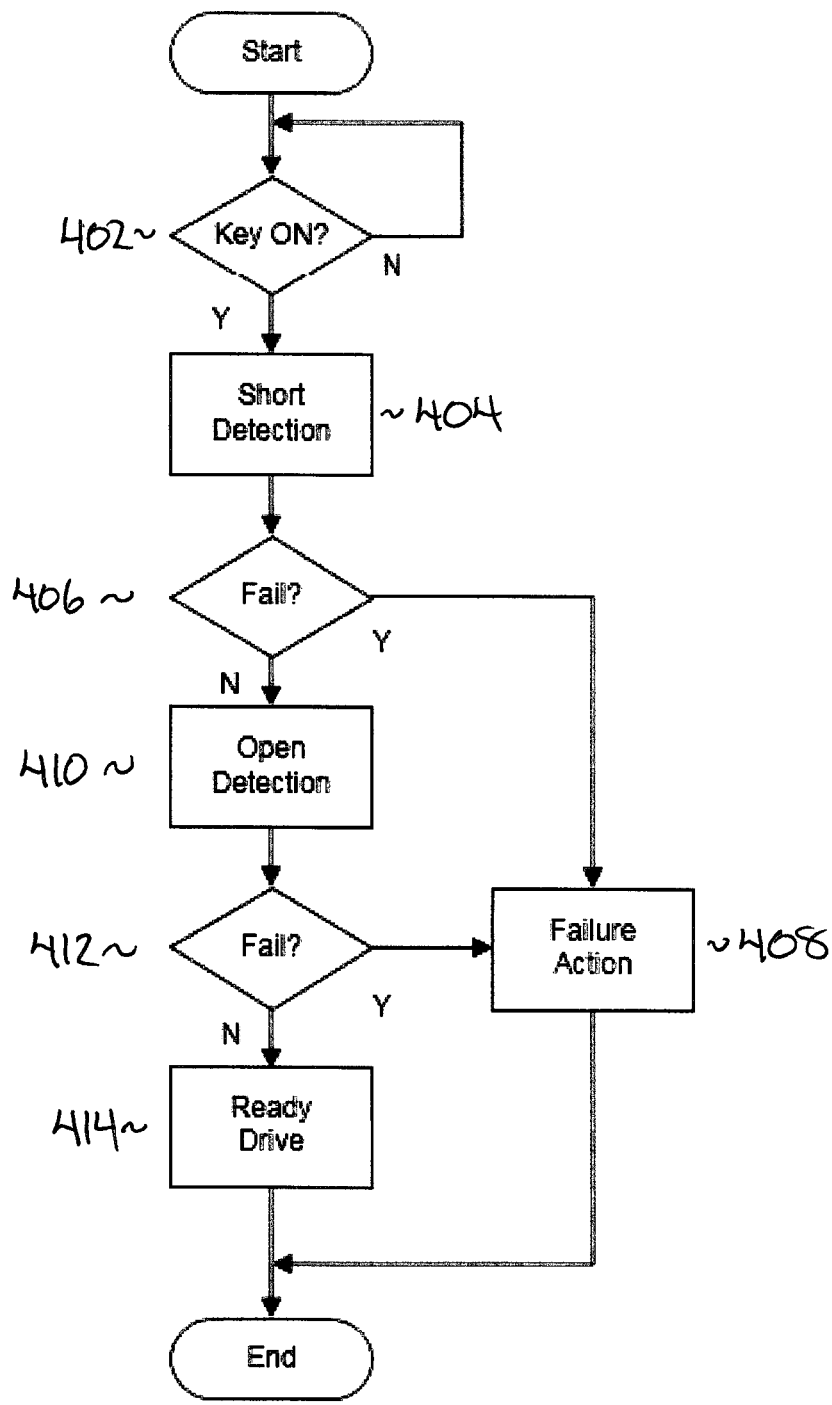
FIG. 4 shows the flow chart at initial sequence.

FIG. 4 shows an example of the failure detection process flow from key ON. Once driver turns on the key (402), short circuit detection (404) will begin. If short circuit failure is detected (406), the vehicle failure action (408) will take place accordingly. If no short circuit failure is detected (410), the open circuit failure detection process will begin (412). If open circuit failure is detected, the vehicle failure action will take place accordingly (408). If no open circuit failure is detected, the vehicle is ready to drive (414).

Figure 5:
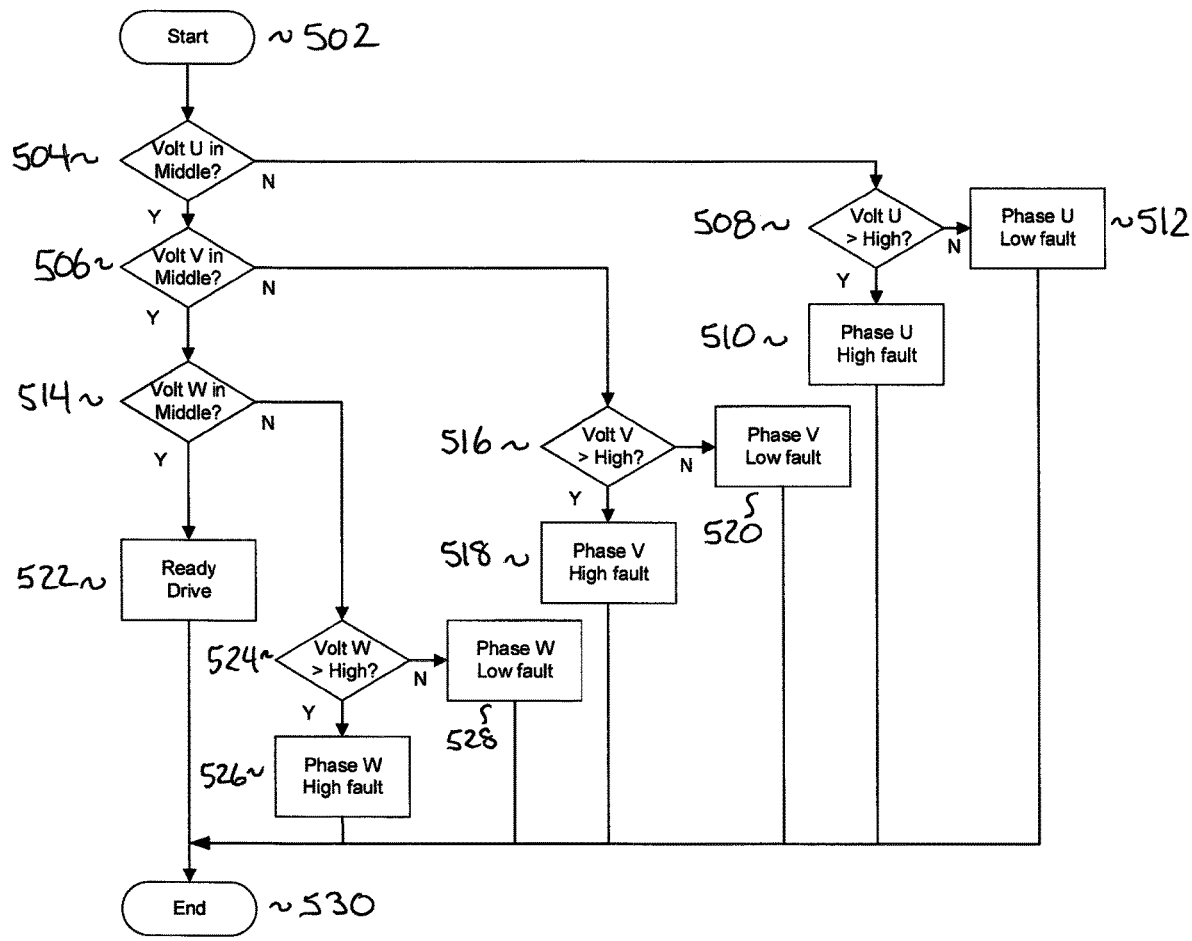
FIG. 5 shows the flow chart of short failure detection.

FIG. 5 shows an example of short circuit detection process flow in detail. Once the driver turns the key ON (502), short circuit detection will begin. If voltage U is balanced in the middle of the +DC/−DC voltage (504), voltage V is detected (506); if it is not, the system determines whether voltage U is high (508). A detection of high voltage results in a diagnosis that there is a Phase U High Fault (510), while a detection that the voltage U is not high results in a diagnosis that there is a Phase U Low Fault (512). The determination of a Phase U Fault ends (530). If voltage V is balanced in the middle of the +DC/−DC voltage, voltage W (514) is detected; if not, the system will determine whether voltage V is high (516). A detection of high voltage results in a diagnosis that there is a Phase V High Fault (518), while a detection that the voltage V is not high results in a diagnosis that there is a Phase V Low Fault (520). The determination of a Phase V Fault ends (530). If voltage W is balanced in the middle of the +DC/−DC voltage, the system finds that the vehicle is ready to drive (522); if it is not, whether voltage W is high is determined (524). A detection of high voltage results in a diagnosis that there is a Phase W High Fault (526), while a detection that the voltage W is not high results in a diagnosis that there is a Phase W Low Fault (528). The determination of a Phase W Fault ends (530).

Figure 6:
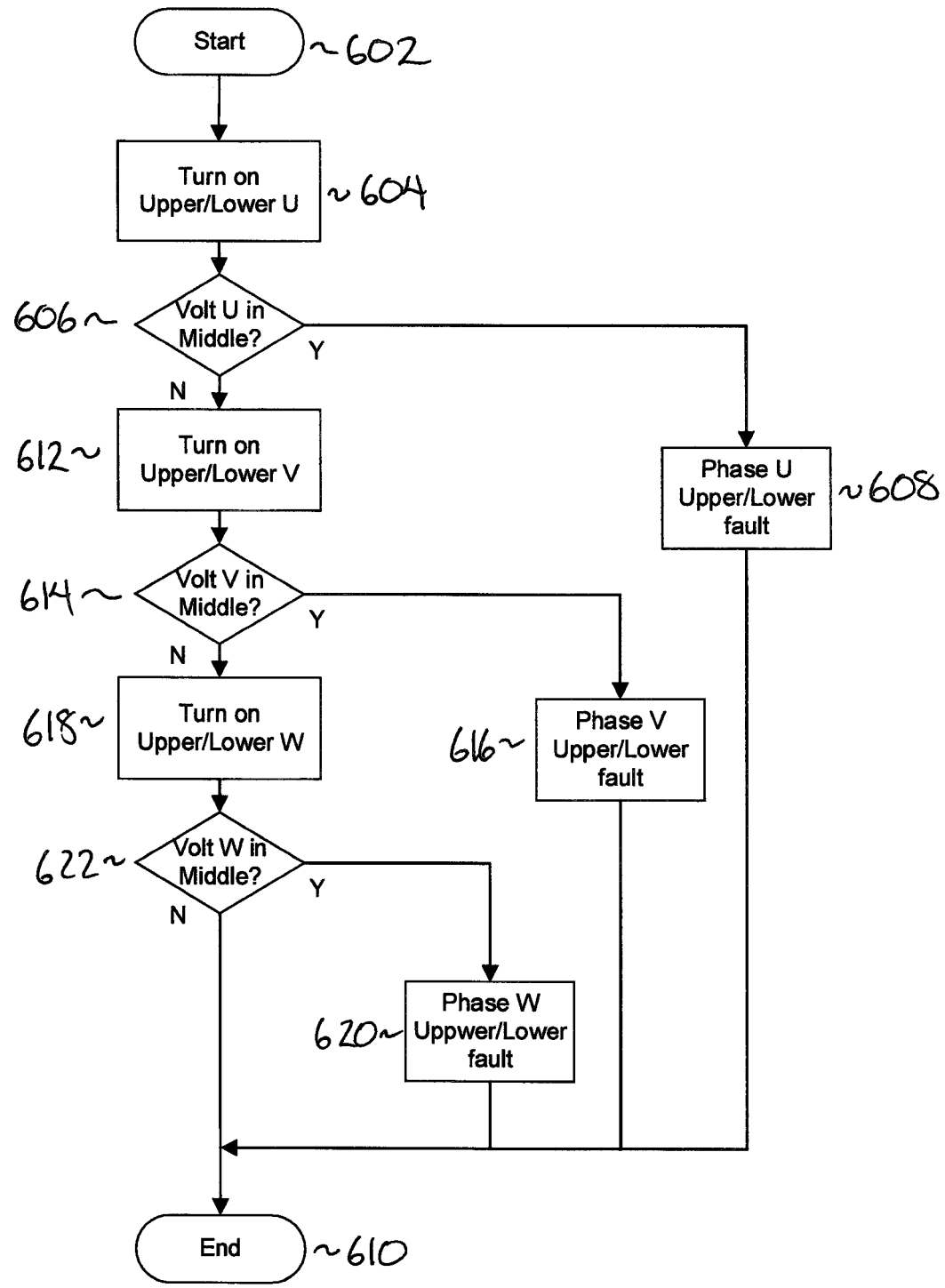
FIG. 6 shows the flow chart of open failure detection.

FIG. 6 shows an example of open circuit detection process flow in detail. Once driver turns on the key (602), the detection of the IGBT related to the Upper/Lower voltage of Phase U is turned ON (604). If voltage U is in the middle (606), the system finds that there is an Upper/Lower Open Circuit Phase U Fault (608) and the determination of a Phase U Open Circuit Fault ends (610). If it is not, the IGBT related to the Upper/Lower voltage of Phase V is turned ON (612). A detection that voltage V is in the middle (614) results in a finding that there is an Upper/Lower Open Circuit Phase V Fault (616), and the determination of a Phase V Open Circuit Fault ends (610). A detection that voltage V is not in the middle results in the turning ON of the IGBT related to the Upper/Lower voltage of Phase W (618). If voltage W is in the middle, the system finds that there is an Upper/Lower Open Circuit Phase W Fault (620), and the determination of a Phase W Open Circuit Phase W Fault ends (610), while a determination that it is in the middle ends the open circuit detection process indicates that the vehicle is ready to drive (622).

The invention claimed is:

1. A method of detecting an IGBT short circuit failure of an IGBT open circuit failure during electric vehicle ON and charging conditions, wherein the method comprises:
  a) receiving information that a vehicle key has been turned on;
  b) detecting whether there is an IGBT short circuit failure;
  c) initiating vehicle failure action when an IGBT short circuit failure is detected, but detecting whether there is an IGBT open circuit failure when IGBT short failure is not detected;
  d) determining that the vehicle is ready to drive when IGBT short failure was not detected
wherein detecting whether there is an IGBT short circuit failure comprises:
  a) detecting whether a voltage U is balanced in the middle of a +DC/−DC voltage;
  b) detecting whether a voltage V is balanced in the middle of the +DC/−DC voltage when voltage U is balanced, but determining there is either a Phase U High Fault or Phase U Low Fault when it is not;
  c) detecting whether a voltage W is balanced in the middle of the +DC/−DC voltage when voltage V is balanced, but determining there is either a phase V High Fault or Phase V Low Fault when it is not;
  d) initiating IGBT open circuit failure detection when voltage W is balanced, but initiating vehicle failure action when it is not.

2. A method of detecting an IGBT short circuit failure of an IGBT open circuit failure during electric vehicle ON and charging conditions, wherein the method comprises:
  a) receiving information that a vehicle key has been turned on;
  b) detecting whether there is an IGBT short circuit failure;
  c) initiating vehicle failure action when an IGBT short circuit failure is detected, but detecting whether there is an IGBT open circuit failure when IGBT short failure is not detected;
  d) determining that the vehicle is ready to drive when IGBT short failure was not detected
wherein detecting whether there is an IGBT open circuit failure comprises:
  a) turning ON an IGBT related to the Upper/Lower voltage of Phase U;
  b) detecting whether voltage U is balanced in the middle of +DC/−DC voltage by two dividing resistors;
  c) turning ON an IGBT related to the Upper/Lower voltage of Phase V when a voltage U is not balanced in the middle of +DC/−DC voltage by two dividing resistors, but determining that there is a Phase U Open Circuit Fault when it is;
  d) detecting whether a voltage V is balanced in the middle of +DC/−DC voltage by two dividing resistors;
  e) turning ON an IBGT related to the Upper/Lower voltage of Phase W when voltage V is not balanced in the middle of +DC/−DC voltage by two dividing resistors, but determining that there is a Phase V Open Circuit Fault when it is;
  f) detecting whether a voltage W is balanced in the middle of +DC/−DC voltage by two dividing resistors;
  g) determining that the vehicle is ready to drive when voltage W is not balanced in the middle of +DC/−DC voltage by two dividing resistors, but determining that there is a Phase W Open Circuit Fault when it is.

* * * * *